United States Patent [19]

Nakase

[11] Patent Number: 5,793,222
[45] Date of Patent: Aug. 11, 1998

[54] INPUT CIRCUIT

[75] Inventor: Yasunobu Nakase, Tokyo, Japan

[73] Assignee: Mitsubishi Denki Kabushiki Kaisha, Tokyo, Japan

[21] Appl. No.: 654,204

[22] Filed: May 28, 1996

[30] Foreign Application Priority Data

Dec. 26, 1995 [JP] Japan .................................. 7-339441

[51] Int. Cl.[6] ...................... H03K 17/16; H03K 19/0175
[52] U.S. Cl. .................................. 326/27; 326/86; 326/83
[58] Field of Search ........................... 326/86, 83, 57, 326/58, 121, 87, 26, 27; 327/380, 381, 392, 398, 399

[56] References Cited

U.S. PATENT DOCUMENTS

| 4,983,860 | 1/1991 | Yim et al. | 326/87 |
| 4,985,644 | 1/1991 | Okihara et al. | 326/83 |
| 5,057,711 | 10/1991 | Lee et al. | 326/98 |
| 5,440,182 | 8/1995 | Dobbelaere | 326/83 |
| 5,654,648 | 8/1997 | Medhekar et al. | 326/58 |
| 5,666,069 | 9/1997 | Gibbs | 326/83 |

OTHER PUBLICATIONS

1995 IEEE International Solid–State Circuits Conference Tech. Papers, pp. 252–253, Masashi Horiguchi, et al., "An Experimental 220MHz 1Gb DRAM".
1992 IEEE International Solid–State Circuits Conference Tech. Papers, pp. 58–59, Bill Gunning, et al., "A CMOS Low–Voltage–Swing Transmission–Line Transceiver".

*Primary Examiner*—Edward P. Westin
*Assistant Examiner*—Richard Roseen
*Attorney, Agent, or Firm*—Oblon, Spivak, McClelland, Maier & Neustadt, P.C.

[57] ABSTRACT

An input circuit of an input-output device has a waveform shaping function to relieve waveform distortion at an input-output line so that the upper bound of an operating frequency is enhanced while keeping sufficiently high and low signal levels. A signal waveform given to the input-output line is shaped by an inverter and transmitted as an input signal to an internal circuit. When receiving a signal, the input circuit of the input-output device uses a feedforward operation on the signal applied to the input-output line so as to shape the signal present on the input-output line. A period for the feedforward operation is determined by the delay time of a delay element.

19 Claims, 11 Drawing Sheets

INPUT CIRCUIT

BACKGROUND OF THE INVENTION

1. Field of the Invention

The present invention relates to an interface circuit in which data transfer can be performed by a bus at a high speed.

2. Description of the Background Art

Generally, data transfer between a processor and a main memory is performed by a bus. The main memory is formed by a plurality of modules which are printed boards. In general, 8 to 9 dynamic RAMs (hereinafter referred to as DRAMs) are provided on each module. One of the modules is selected to write and read data to and from the processor.

If the DRAM provided on the module has a 4-bit input-output, 32-bit (4-bit input-output×8) or 36-bit (4-bit input-output×9) data can be written or read at the same time.

FIG. 11 is a circuit diagram typically showing the connection of the processor to the module in the vicinity of plural transmission lines forming a bus. Input-output circuits I/O-0, I/O-1, . . . , I/O-n for 0th, 1st, . . . , n-th modules are connected to the bus through nodes ND-0, ND-1, . . . , ND-n respectively. The nodes ND-0, ND-1, . . . , ND-n are provided in this order. The adjacent nodes are connected through transmission lines G0 to G(n-1) having a characteristic impedance Zo and a delay time Tm. For example, the characteristic impedance Zo has a value of 50Ω.

The i-th module (i=0, 1, . . . , n) is connected to the node ND-i through a transmission line Fi having a characteristic impedance Zp and a delay time Ts. For example, the characteristic impedance Zp has a value which is equal to that of the characteristic impedance Zo.

The input-output circuit I/O-P of the processor is connected to the node ND-0 through the transmission line G0 having the characteristic impedance Zo. For impedance matching, both ends of the bus are terminated by a termination resistor Ro having a value of 50Ω. A termination potential Vtt is given to the termination resistor Ro. Usually, the termination potential Vtt is set to a value which is half of a supply voltage VDD.

FIG. 12 is a circuit diagram showing the structure of an input-output circuit according to the prior art. An output circuit DV and an input circuit RV are connected to an input-output line W. When an output enable signal OE has a high level, the output circuit DV outputs data DOUT. When the output enable signal OE has a low level, an output terminal is in a high impedance state. The input circuit RV shapes the waveform of a signal sent to the input-output line W by means of an inverter, and then sends an input signal DIN to the processor or the DRAM as an internal circuit.

On the bus having the above structure, the node ND-i cannot get characteristic impedance matching.

It is supposed that data is output from the processor and received by the DRAM. The data output from the processor is driven by the input-output circuit I/O-P, and transmitted on the transmission line G0 having the characteristic impedance Zo to reach the node ND-0. The data branches to a transmission line G1 having the characteristic impedance Zo and a transmission line F0 having the characteristic impedance Zp. The values of the characteristic impedance generated by the transmission lines G1 and F0 are different from the value Zo of the characteristic impedance of the transmission line G0 on which the data is transmitted before reaching the node ND-0.

FIG. 13 is a conceptual diagram typically showing the state in which the data output from the processor is transmitted on the node ND-0. For simplicity, problems are taken into consideration on the assumption that Zp is equal to Zo. Even if Zp is not equal to Zo, the same problems arise.

It is assumed the state in which a voltage is 0 everywhere on the bus is the initial state. A voltage of the data which is output from the processor and transmitted on the transmission line G0 to the node ND-0 is indicated with Vp. A transmission coefficient and a reflection coefficient of the node ND-0 are indicated at $\tau$ and $\gamma$ respectively. A signal Vs which is transmitted on the transmission line F0 from the node ND-0 to the input-output circuit I/O-0 for the 0th module and a signal Vm which is transmitted on the transmission line G1 to the node ND-1 have a voltage of $\tau$Vp immediately after transmitted from the node ND-0.

The reference of a time t is set to the time when the node ND-0 is first reached. The signal of the input-output circuit I/O-0 has a voltage V. The signal Vs reaches the input-output circuit I/O-0 late by a delay time Ts required for the transmission on the transmission line F0. Consequently, the voltage V has a value of 0 before a time Ts. At the time Ts, V is equal to $\tau$Vp.

At a time (2Tm+Ts), the signal Vm is reflected by the node ND-1, and goes and comes back on the transmission line G1. Then, the signal Vm is transmitted on the transmission line F0 through the node ND-0 to reach the input-output circuit I/O-0. Consequently, V is equal to ($\tau$Vp+$\tau^2\gamma$Vp).

In the case where the input-output circuit I/O-0 functions as an input it shows, an high-impedance state. Consequently, the signal Vs which reaches the input-output circuit I/0-0 is completely reflected with a reflection coefficient of 1, and is transmitted on the transmission line F0 toward the node ND-0, then reflected with a reflection coefficient $\gamma$ on the node ND-0, and then transmitted toward the input-output circuit I/O-0. A time necessary for this signal to reach the input-output circuit I/O-0 is 3Ts. For example, if the delay time of each transmission line is set around Tm=100 ps and Ts=150 ps, Ts>Tm is formed. Consequently, a time 3Ts is later than a time (2Tm+Ts), and (V=$\tau$Vp+$\tau^2\gamma$Vp+$\gamma\tau$Vp) is formed.

At a time (4Tm+Ts), a signal having a voltage value of $\tau^4\gamma$Vp which is obtained by a signal goes and comes back on the transmission lines G1 and G2 among the nodes ND-0, ND-1 and ND-2 and is then transmitted on the transmission line F0 and a signal having a voltage value of $\tau^2\gamma3$Vp which is obtained by a signal goes and comes back on the transmission line G1 twice and is then transmitted on the transmission line F0 reach the input-output circuit I/O-0. However, the time (4Tm+Ts) is later than the time 3Ts because of Ts<2Tm.

The following equations are obtained:

$\tau=2(Zo/2)/(Zo/2+Zo)=2/3$, and $\gamma=(Zo/2-Zo)/(Zo/2+Zo)=-1/3$ wherein the negative sign indicates that the sign of a voltage is inverted.

Accordingly, the transition of the voltage V is expressed as follows.

i) $0 \leq t < Ts: V=0$ ii) $Ts \leq t < 2Tm+Ts: V=(2/3)Vp$ iii) $2Tm+Ts \leq t < 3Ts: V=(14/27)Vp$ iv) $3Ts \leq t < 4Tm+Ts: V=(8/27)Vp$ v) $t=4Tm+Ts: V=(52/243)Vp$ It is proved that the voltage V rises at the time Ts and then is decreased sequentially because y is negative. The reason is that the signal which is reflected and transmitted on each node and reaches the input-output circuit I/O-0 has the function of reducing the voltage V.

As a matter of course, a signal which increases the voltage V also reaches the input-output circuit I/O-0. For example, when the signal Vs which has already been transmitted on the transmission line F0 to reach the input-output circuit I/O-0 further goes and comes back on the transmission line F0 twice to reach the input-output circuit I/O-0, the voltage V is increased by $\gamma^2 \tau Vp$. However, it takes a time 5Ts to obtain the voltage $\gamma^2 \tau Vp$. If Ts is greater than Tm as described above, the voltage V is not affected by the voltage $\gamma^2 \tau Vp$ till the time (4Tm+Ts).

Thus, the voltage given to the input-output circuit I/O-0 is changed. Then, the change is disturbed for a comparatively short period. Accordingly, it is harder to fully keep a high or low level at a DRAM input end as the frequency of the signal is increased. Consequently, the maximum operating frequency of the bus is not determined by the current driving force of an output circuit but by the physical shape and characteristics of the transmission line. Also in the case where data is output from the DRAM and received by the processor, the same problems arise.

SUMMARY OF THE INVENTION

A first aspect of the present invention is directed to an input circuit in which potentials present within first and second ranges correspond to first and second binary logics, respectively, comprising (a) an input line on which an input potential is transmitted, (b) first driving means for forcibly putting the input potential in the second range when a first driving control signal is activated, and (c) first driving control means for activating the first driving control signal for a constant period after a first transition in which the input potential is transferred from the first range to the second range.

A second aspect of the present invention is directed to the input circuit according to the first aspect of the present invention, wherein the input potential also performs a second transition from the second range to the first range, the first driving control means comprising (c-1) a delay element including an input end connected to the input line, and an output end for outputting a delay input signal, the delay input signal, performing third and fourth transitions delayed for the constant period after first and second transitions respectively, (c-2) a first switch including a first end connected to the input line and a second end for outputting a first control signal, the first and second ends being non-conductive corresponding to the value of the delay input signal obtained by the third transition, and being conductive corresponding to the value of the delay input signal obtained by the fourth transition, and (c-3) a second switch including a first end to which a potential equivalent to the first driving control signal that is activated is given, and a second end for outputting the first driving control signal, the first and second ends being non-conductive if the first control signal is present within the first range, and being conductive if the first control signal is present within the second range.

A third aspect of the present invention is directed to the input circuit according to the second aspect of the present invention, wherein the first driving control means further comprises (c-4) a third switch including a first end to which a potential present within the first range is given, and a second end connected to the second end of the first switch for outputting the first control signal, the first and second ends being conductive/non-conductive complementarily to the first switch.

A fourth aspect of the present invention is directed to the input circuit according to the third aspect of the present invention, wherein the first driving control means further comprises (c-5) a first resistive element including a first end to which a potential equivalent to the driving control signal which is deactivated is given, and a second end connected to the second end of the second switch.

A fifth aspect of the present invention is directed to the input circuit according to the fourth aspect of the present invention, wherein the first resistive element comprises (c-5-1) a fourth switch including first and second ends connected to the first and second ends of the first resistive element respectively, the first and second ends being conductive if the delay input signal is present within the second range, and (c-5-2) a potential specified resistor connected to the fourth switch in parallel.

A sixth aspect of the present invention is directed to the input circuit according to the fifth aspect of the present invention, wherein the potential specified resistor is formed by a MOS transistor which includes first and second ends connected to the first and second ends of the first resistive element respectively, the first and second ends being conductive/non-conductive respectively if the input potential is present within the first and second ranges.

A seventh aspect of the present invention is directed to the input circuit according to the fourth aspect of the present invention, wherein the first driving means comprises (b-1) a driving MOS transistor including a source to which a first potential present within the second range that is the farthest from the first range is given, a drain connected to the input line, and a gate electrode, the gate electrode of the driving MOS transistor being connected to the second end of the first resistive element, the first driving control signal being activated and deactivated within the first and second ranges respectively, and the first driving control means further comprises (c-6) a voltage supporting element including a first end to which the first potential is given, and a second end connected to the first end of the first resistive element, the voltage supporting element supporting the threshold voltage of the driving MOS transistor between the first and second ends.

An eighth aspect of the present invention is directed to the input circuit according to the second aspect of the present invention, wherein the first driving control means further comprises (c-4) a differential input amplifier inserted between the input line and the input end of the delay element, the first input end, the second input end and the output end of the differential input amplifier being connected to the input line, a reference potential point, and the input end of the delay element respectively.

A ninth aspect of the present invention is directed to the input circuit according to the eighth aspect of the present invention, wherein the second input end of the differential input amplifier is connected to a reference potential point through a potential control resistor, and wherein the transition of a signal output from the output end of the differential input amplifier is delayed and transmitted to the second input end of the differential input amplifier.

A tenth aspect of the present invention is directed to the input circuit according to the first aspect of the present invention, further comprising (d) a driving suppress resistor inserted between the input line and the first driving means.

An eleventh aspect of the present invention is directed to the input circuit according to the first aspect of the present invention, further comprising (d) second driving means for forcibly putting the input potential in the first range if a second driving control signal is activated, and (e) second driving control means for activating the second driving control signal for a constant period after a second transition in which the input potential is transferred from the second range to the first range.

A twelfth aspect of the present invention is directed to the input circuit according to the eleventh aspect of the present invention, further comprising (f) a first logic circuit that includes a first input end to which one of a pair of complementary output signals is input and a second input end to which the first driving control signal is sent, and outputs OR of data given to the first and second input ends to the first driving means, and (g) a second logic circuit that includes a first input end to which the other of said pair of complementary output signal is input and a second input end to which the second driving control signal is sent, and outputs OR of data given to the first and second input ends to the second driving means.

A thirteenth aspect of the present invention is directed to the input circuit according to the second aspect of the present invention, wherein the first driving control means further comprises (c-4) a logic circuit connected to the delay element in series for receiving a switching signal, the logic circuit causing the first switch to be non-conductive and fixing the first control signal to the second logic if the switching signal has a predetermined logic.

A fourteenth aspect of the present invention is directed to the input circuit according to the eleventh aspect of the present invention, wherein the delay element includes the series connection of plural inverters, the second driving control means further comprising (c-4) a logic circuit inserted in the series connection of plural inverters in series for receiving a switching signal, the logic circuit causing the first switch to be non-conductive and fixing the second control signal to the first logic if the switching signal has a predetermined logic.

According to the first aspect of the present invention, a disturbance may occur on the input line so as to cause the input potential to approach the first range after the input potential is transferred from the first range to the second range. The first driving means forcibly puts the input potential in the second range against the disturbance. Consequently, feedforward operation is performed so that the influence of the disturbance can be suppressed. In addition, the forcible driving is kept only for a constant period so that the original transition of the input potential other than the disturbance is not obstructed.

According to the second aspect of the present invention, the first control signal for controlling the operation of the second switch is activated only for a constant period by the delay element and the first switch. For this period that is, the delay time of the delay element, the driving control signal is activated.

According to the third aspect of the present invention, the delay input signal performs a third transition when a constant period passes after the input potential performs the first transition. Consequently, the first switch is turned OFF and the third switch forcibly puts the first control signal in the first range so that the second switch is turned OFF, thereby terminating the activated state of the first driving control signal.

According to the fourth aspect of the present invention, the first resistive element can deactivate the first driving control signal when the second switch is non-conductive. Consequently, the feedforward operation is not performed by the first driving means.

According to the fifth aspect of the present invention, the fourth switch is conductive when a constant period passes after the input potential performs the first transition. Consequently, the first driving control signal is rapidly deactivated. Then, the input potential performs the second transition. Thereafter, even if the fourth switch is non-conductive after the constant period passes, the potential specified resistor keeps the first driving control signal in the deactivated state as long as the second switch is non-conductive.

According to the sixth aspect of the present invention, the input circuit is formed by the MOS transistor rather than the resistor so that the necessary area can be reduced. The MOS transistor as the potential specified resistor can deactivate the first driving control signal when the input potential is present within the first range. If the input potential is kept within the second range after the first transition, the MOS transistor cannot deactivate the first driving control signal. However, the first driving control signal can be deactivated by the fourth switch when the constant period passes after the first transition.

According to the seventh aspect of the present invention, the voltage supporting element can set the first driving control signal to the threshold voltage of the driving MOS transistor. Accordingly, the operation of the driving MOS transistor can be performed rapidly so that the time necessary for the feedforward operation can be reduced.

According to the eighth aspect of the present invention, the differential input amplifier can give a potential corresponding to full-swing to the input end of the delay element so that the transition of the delay input signal can be performed rapidly even if the input potential does not perform the full-swing, that is, the transition width of the input potential is less than a difference between the first and second potentials, the first potential being the farthest from the first range within the second range and the second potential being the farthest from the second range within the first range.

According to the ninth aspect of the present invention, a voltage drop which occurs on the potential suppress resistor changes the potential given to the first input end of the differential input amplifier based on the reference potential. Consequently, the transition of the input line can be judged rapidly.

According to the tenth aspect of the present invention, the input potential might be moved so as to go away from the first range by the superposition of reflected waves with respect to the input line having the input potential which is forcibly put in the second range by the first driving means. The driving suppress resistor apparently suppresses the forcible driving ability of the first driving means for the input potential. Consequently, the unnecessary deviation of the input potential can be suppressed.

According to the eleventh aspect of the present invention, the feedforward operation can also be performed on the input potential which executes the second transition as well as the first transition.

According to the twelfth aspect of the present invention, the input line can be driven based on the output signal pair by using the first and second driving means, and the input circuit can also serve as a portion necessary for the output circuit. Consequently, the required area can be reduced.

According to the thirteenth and fourteenth aspects of the present invention, the logic of the input end of the delay element is fixed by the switching signal so that the operation of the first driving means is stopped when the feedforward operation is not required, power consumption can be reduced.

7

In order to solve the above problems, it is an object of the present invention to enhance the maximum operating frequency of a bus.

These and other objects, features, aspects and advantages of the present invention will become more apparent from the following detailed description of the present invention when taken in conjunction with the accompanying drawings.

DESCRIPTION OF THE PREFERRED EMBODIMENTS

The present invention causes an input circuit which is a part of an input-output circuit to have the waveform shaping function so as to relieve a waveform distortion at each input end, and improves the upper bound of an operating frequency which can keep a sufficient high or low level.

First Embodiment

Figure 1:
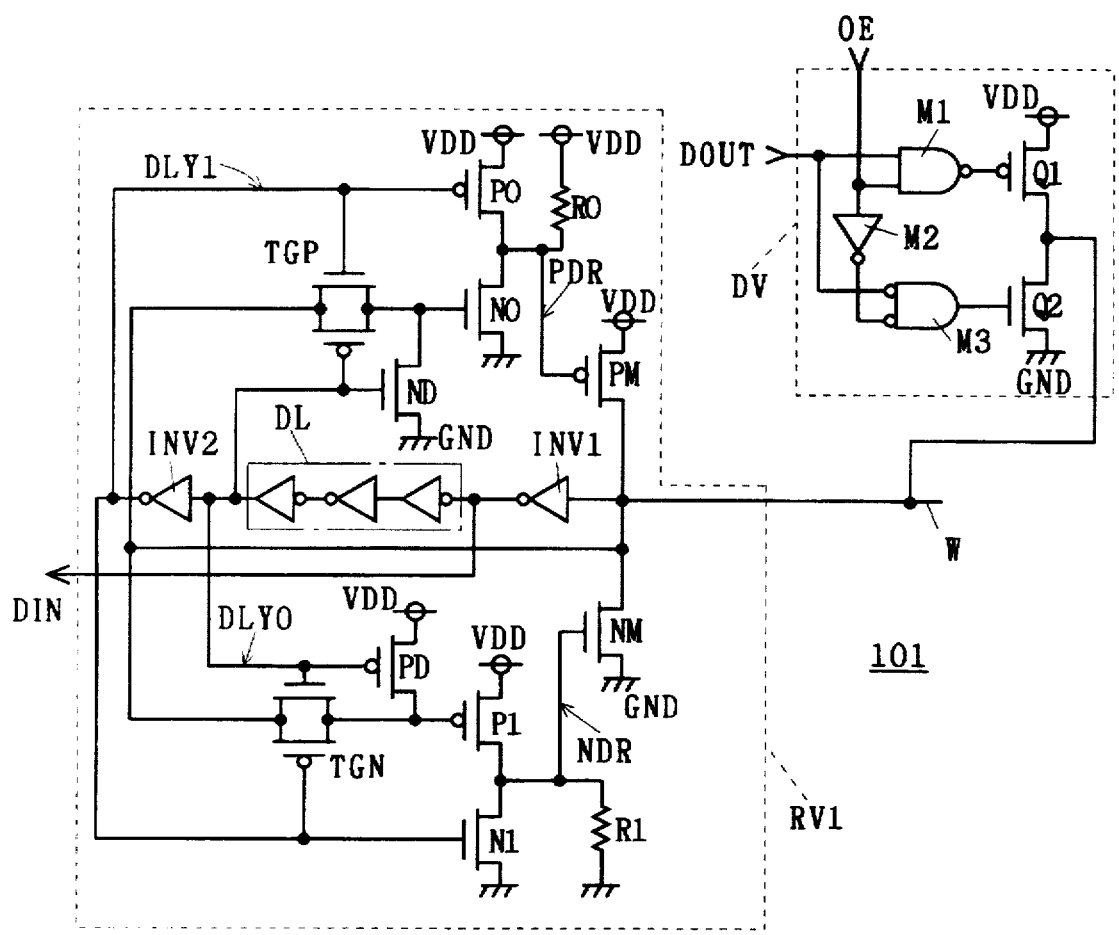
FIG. 1 is a circuit diagram showing a structure according to a first embodiment of the present invention.

FIG. 1 is a circuit diagram showing the structure of an input-output circuit 101 according to a first embodiment of the present invention. An output circuit DV and an input circuit RV1 are connected to an input-output line W.

An output enable signal OE and output data DOUT are sent to the output circuit DV. The output enable signal OE is sent to one of input ends of a 2-input NAND circuit M1, and inverted by an inverter circuit M2 and sent to one of input ends of a 2-input NOR circuit M3. The output data DOUT is sent to the other input end of the NAND circuit M1 and the other input end of the NOR circuit M3 in common.

The output end of the NAND circuit M1 is connected to the gate of a PMOS transistor Q1. The output end of the NOR circuit M3 is connected to the gate of an NMOS transistor Q2. The drains of the transistors Q1 and Q2 are connected to the input-output line W in common. A ground potential GND and a potential VDD are given to the sources of the transistors Q2 and Q1 respectively. VDD is greater than GND.

8

When the output enable signal OE has a high level, the logic reverse to the output data DOUT is given to the gates of the transistors Q1 and Q2. Accordingly, the transistors Q1 and Q2 invert the logic given to their gates and send the same logic as the output data DOUT to the input-output line W. When the output enable signal OE has a low level, the transistors Q1 and Q2 are turned OFF so that the input-output line W shows a high-impedance state.

The input circuit RV1 has the following structure. The input circuit RV1 comprises an inverter circuit INV1 having an input end connected to the input-output line W, and an output end which sends an input signal DIN to an internal circuit. The input end of a delay element DL which delays a signal along with logic inversion is connected to the output end of the inverter circuit INV1. The delay element DL is implemented by a 3-stage inverter circuit, for example.

An inverter circuit INV2 has an input end connected to the output end of the delay element DL, and an output end connected to the gates of a PMOS transistor P0 and an NMOS transistor N1. The potentials VDD and GND are given to the sources of the PMOS transistor P0 and NMOS transistor N1 respectively.

The drain of an NMOS transistor N1 is connected to that of the PMOS transistor P0. The potential GND is given to the source of the NMOS transistor N0. The drain of a PMOS transistor P1 is connected to that of the NMOS transistor N1. The potential VDD is given to the source of the PMOS transistor P1.

The drain of an NMOS transistor ND is connected to the gate of the NMOS transistor N0. The potential GND is given to the source of the NMOS transistor ND. The drain of a PMOS transistor PD is connected to the gate of the PMOS transistor P1. The potential VDD is given to the source of the PMOS transistor PD. The output end of the delay element DL is connected to the gates of the PMOS transistor PD and NMOS transistor ND in common.

The input ends of transmission gates TGP and TGN are connected to the input-output line W in common. The transmission gates TGP and TGN are formed by the parallel connection of the NMOS transistor to the PMOS transistor. The output end of the inverter circuit INV2 is connected to the gate of the NMOS transistor which forms the transmission gate TGP and the gate of the PMOS transistor which forms the transmission gate TGN in common. The output end of the delay element DL is connected to the gate of the PMOS transistor which forms the transmission gate TGP and the gate of the NMOS transistor which forms the transmission gate TGN in common.

The drains of PMOS and NMOS transistors PM and NM are connected to the input-output line W in common. The potentials VDD and GND are given to the sources of the PMOS and NMOS transistors PM and NM respectively.

The gate of the PMOS transistor PM is connected to the drains of the transistors P0 and N1 in common. The gate of the NMOS transistor NM is connected to the drains of the transistors P1 and N1 in common.

A resistor R0 has a first end for receiving the potential VDD and a second end connected to the gate of the PMOS transistor PM. A resistor R1 has a first end for receiving the potential GND and a second end connected to the gate of the NMOS transistor NM.

Generally, the input circuit RV1 shapes the signal waveform sent to the input-output line W by means of the inverter INV1, and transmits an input signal DIN to an internal circuit. In that case, feedforward operation is performed on the potential of the input-output line W by the transistors PM and NM.

9

Figure 2:
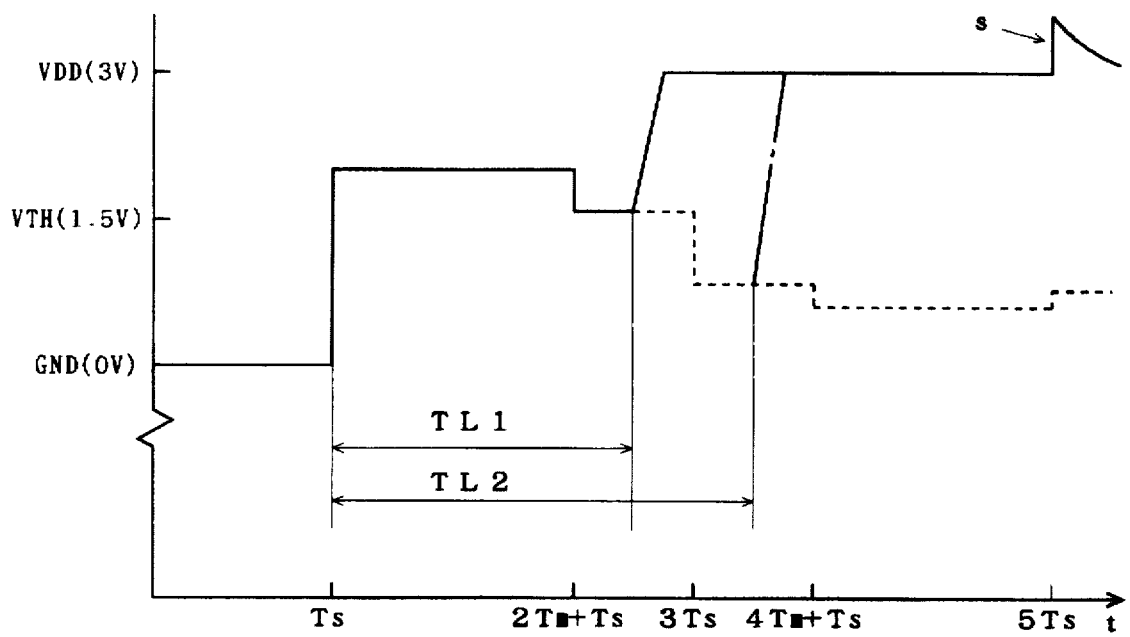
FIG. 2 is a graph showing operation according to the first embodiment of the present invention.

FIG. 2 is a graph showing the change in potential of the input-output line W. A solid line indicates the operation of the input circuit RV1, and a broken line indicates the operation according to the background art for comparison. The operation of the input circuit RV1 will be described below with reference to FIG. 2. For simplicity, it is assumed that the potential GND is given to the input-output line W in the initial state. The potentials VDD and GND function as high- and low-level logics respectively.

A signal DLY0 output from the delay element DL has a low level, and a signal DLY1 output from the inverter circuit INV2 has a high level. Consequently, the transmission gate TGN is OFF and the PMOS transistor PD is ON so that the gate potential of the PMOS transistor P1 is about VDD and the PMOS transistor P1 is turned OFF. Since the NMOS transistor N1 is ON, the gate potential NDR of the NMOS transistor NM is about GND and the NMOS transistor NM is OFF.

The transmission gate TGP is ON and the NMOS transistor ND is OFF. The low level is given to the gate of the NMOS transistor N0. Consequently, the NMOS transistor N1 is turned OFF. Furthermore, the PMOS transistor P0 is also OFF so that the gate potential PDR of the PMOS transistor PM is fixed to the potential VDD through the resistor R0. Accordingly, the PMOS transistor PM is also OFF.

Since the transistors PM and NM are OFF as described above, the input-output line W is fixed to the high-impedance state with the low-level potential kept in the initial state.

It is supposed that the input-output circuit I/O-P of the processor sends a signal Vp to the bus in the initial state. If the voltage of the signal Vp is VDD and the potential GND has a value of 0, the voltage and the potential can be used together.

In the case where the input-output circuit 101 is adopted into the input-output circuit I/O-0 for the 0th module, the potential of ($\frac{2}{3}$) Vp=($\frac{2}{3}$) VDD is given to the input-output line W at a time Ts as described above according to the background art.

The signals DLY0 and DLY1 have the low and high levels respectively until the delay time TD of the delay element DL further passes. Accordingly, the transmission gate TGN, PMOS transistor PD, NMOS transistor N1 and NMOS transistor NM are OFF, ON, ON and OFF respectively in the same manner as in the initial state.

Since the transmission gate TGP is ON and the transistors ND and P0 are OFF, the potential ($\frac{2}{3}$) VDD is given to the gate of the NMOS transistor N0.

The absolute values of the threshold voltages Vthn and Vthp of the NMOS and PMOS transistors which adopt a gate length of 0.5 μm are set to 0.6 to 0.8 V. Consequently, even if the potential VDD is set to 3 V, a potential of about 2 V is given to the gate of the NMOS transistor N0 so that the NMOS transistor N0 is turned ON. The gate potential PDR of the PMOS transistor PM is quickly changed to 0.

Consequently, the PMOS transistor PM is turned ON and the potential of the input-output line W is increased to VDD so as to help the change of the input signal. In this case, it is desired that the resistor R0 has a greater value in order to suppress current flow thereto.

When the delay time TD passes, the delay signals DLY0 and DLY1 have the high and low levels respectively. Accordingly, the transmission gate TGP is turned OFF and the NMOS transistor ND is turned ON so that the NMOS transistor N0 is turned OFF. Since the PMOS transistor P0 is turned ON, the gate potential PDR of the PMOS transistor PM is quickly increased to the potential VDD and the PMOS transistor PM is turned OFF.

While the PMOS transistor PD is turned OFF and the transmission gate TGN is turned ON, the PMOS transistor P1 is turned OFF because the input-output line W has the high level. In addition, the NMOS transistor N1 is also turned OFF. However, the potential GND is still given to the gate potential NDR of the NMOS transistor NM by the resistor R1. Consequently, the NMOS transistor NM is turned OFF.

Accordingly, after the delay time TD passes, the transistors PM and NM are turned OFF and the input-output line W returns to the high-impedance state similarly to the initial state.

The feedforward circuit in the receiver responses the voltage change on the input-output line with the delay time TL. The delay time includes the propagation delays of the transmission gate TGP and the transistors N0 and PM. More specifically, the potential of the input-output line W is started to rise at a time (Ts+TL).

If the delay time TL is TL1(=250 ps), the time (Ts+TL) is 400 ps and later than a time (2Tm+Ts=350 ps). Accordingly, the potential of the input-output line W is decreased to about (($\frac{14}{27}$)×3=1.6 V) before the feedforward operation is performed on the input-output line W.

However, the absolute value of the threshold voltage Vthn of the NMOS transistor N0 is set to 0.6 to 0.8 V as described above so that the above operation is not affected. In FIG. 2, such a case is shown by the solid line.

As a matter of course, the above operation is not affected even if the delay time TL is much greater. If the delay time TL is TL2 (=350 ps), the time (Ts+TL) is 500 ps and is later than a time 3Ts (=450 ps). Accordingly, the potential of the input-output line W is decreased to about (($\frac{8}{27}$)×3=0.89 V) before the feedforward operation is performed on the input-output line W. Also in this case, the NMOS transistor N0 is turned ON and the feedforward operation is performed on the input-output line W. In FIG. 2, the operation performed in this case is shown by a dashed line.

The threshold of the inverter circuit INV1 is usually set to VTH which equals to (VDD−GND)/2 (=1.5 V). Consequently, the potential of the input-output line W is less than the threshold of the inverter circuit INV1 between the times 3Ts and (Ts+TL) for a very short period. For this reason, it is desired that the delay time TL is less than the time 2Ts, i.e., 300 ps or less.

It is desired that the delay time TD of the delay element DL is greater than the total TL of the delay times of the transmission gate TGP and the transistors N0 and PM. If not so, the NMOS transistor ND is turned ON as soon as the NMOS transistor N0 is turned ON, and the NMOS transistor N0 is turned OFF again. For this reason, the PMOS transistor PM is kept ON for a short period or is not turned ON so that the feedforward operation is not fully performed on the input-output line W.

On the contrary, it is not desired that the delay time TD is too great. The reason is that there is a possibility that the new transition of the input-output line W might be obstructed and the upper bound of the operating frequency might be decreased. If n modules are provided as shown in FIG. 1, it takes a time Tq (=8Tm+Ts) to reach the module which is the farthest from the processor, wherein the delay time of a transmission line G0 is indicated with Tm. It takes a time Tq to transmit the influence of the feedforward operation on the farthest module to the processor. Consequently, the influence of the feedforward operation on the same module to the processor is continued for a time (2Tq+TL+TD).

In case of Tm=100 ns, Ts=150 ns and TL=300 ps, 2Tq+TL+TD={2 (8×100+150)+300} ps+TD is formed.

If a signal having a frequency of 250 MHz is transmitted by a bus, it is desired that the signal has a cycle of 4 ns and the above continuation period is less than 4 ns. More specifically, 4000 ps>2200 ps+TD, that is, TD<1800 ps is desired.

In the input circuit 101, the PMOS transistor P0, the NMOS transistor N0, the PMOS transistor PM and the NMOS transistor ND correspond to the NMOS transistor N1, the PMOS transistor P1, the NMOS transistor NM and the PMOS transistor PD respectively. The operation of the transmission gate TGP is balanced with that of the transmission gate TGN. The potentials given to the ends of the resistors R0 and R1 are balanced with each other. For this reason, it is clear that the same operation as the foregoing is performed also in the case where the level of the input-output line W is changed from "high" to "low".

Even if the transistors P0 and N1 are not provided but the resistors R0 and R1 are provided, the potentials PDR and NDR can be increased or decreased. However, it is necessary to quickly turn OFF the transistors PM and NM in order not to obstruct the new transition of the input-output line W. Therefore, it is desired that the transistors P0 and N1 are provided.

As a matter of course, the delay element DL can be implemented by others than the inverter circuit. When the inverter circuit is used, the number of stages should be only odd. The structure of the delay element DL can be changed depending on the manufacturing process to be used, and the operating frequency of the bus.

The structure in which the output circuit DV and the input circuit RV1 are connected to the same input-output line W has been described above. The feedforward function of the input circuit RV1 can be displayed by itself.

According to the present embodiment described above, the operation is performed so as to increase the input potential against the reflected wave which decreases the input potential. Consequently, the distortion of the potential waveform can be controlled. Therefore, the upper bound of the operating frequency which keeps the high and low levels can be enhanced as compared with the background art.

Although potential of the input-output line W has reached a potential corresponding to full-swing by the feedforward operation, it is desired that the potential of the input-output line W given by the input-output circuit I/O-p of the processor meets the predetermined conditions after the delay time TD passes (the steady state is reached). More specifically, it is desired that the high level has a potential of (VDD−|Vthp|) or more and the low level has a potential of (GND+Vthn) or less. If a signal having the high level whose potential is less than (VDD−|Vthp|) is sent to the input-output line W, the PMOS transistor P1 is unnecessarily turned ON. If a signal having a low level whose potential is more than (GND+Vthn) is sent to the input-output line W, the MNOS transistor N0 is unnecessarily turned ON. It is desired that such situation is avoided.

Second Embodiment

Figure 3:
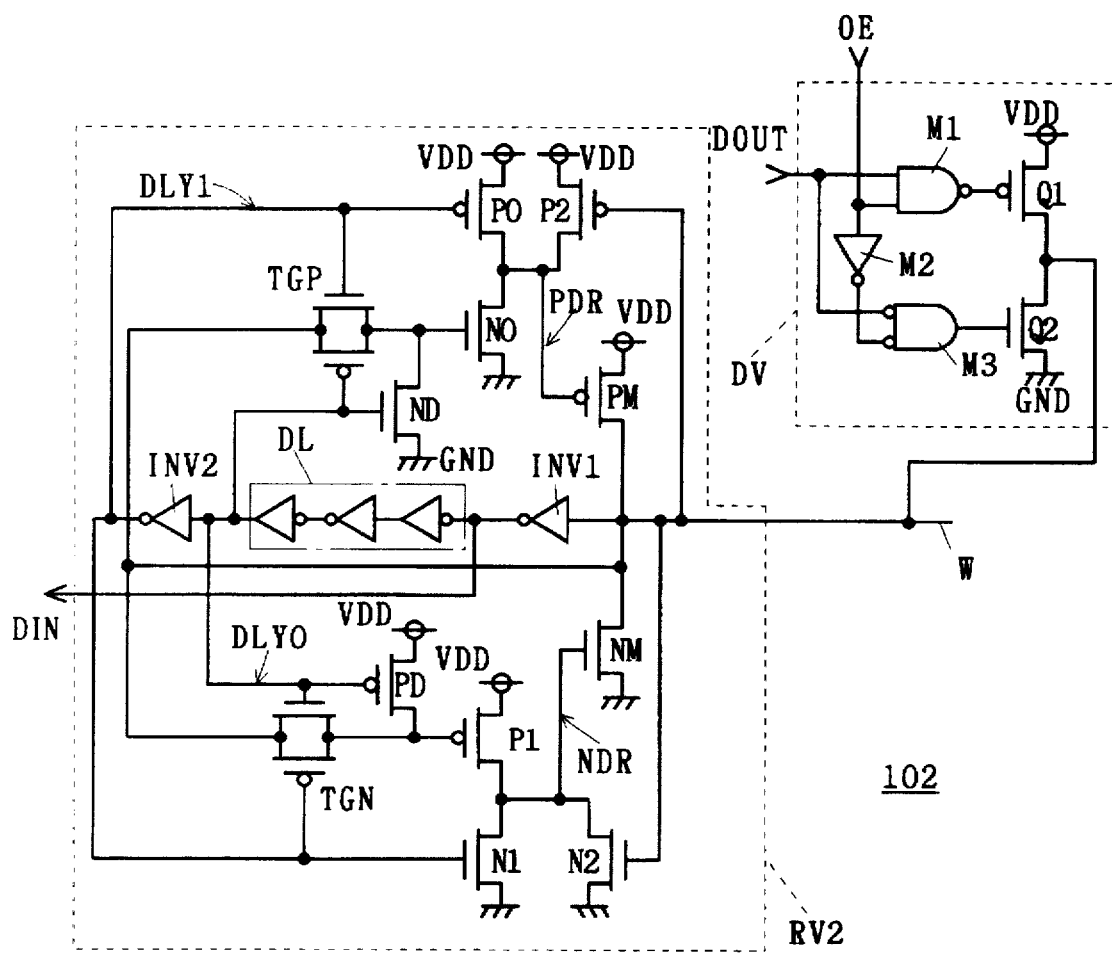
FIG. 3 is a circuit diagram showing a structure according to a second embodiment of the present invention.

FIG. 3 is a circuit diagram showing the structure of an input-output circuit 102 according to a second embodiment of the present invention. The input circuit RV1 of the input-output circuit 101 described in the first embodiment is replaced with an input circuit RV2. The resistors R0 and R1 of the input circuit RV1 are replaced with a PMOS transistor P2 and an NMOS transistor N2 of the input circuit RV2.

Potentials VDD and GND are given to the sources of the PMOS transistor P2 and NMOS transistor N2 respectively. The gates of the PMOS transistor P2 and NMOS transistor N2 are connected to the input-output line W in common. The drain of the PMOS transistor P2 is connected to the drains of the NMOS transistor N0 and the PMOS transistor P0 in common. The drain of the NMOS transistor N2 is connected to the drains of the PMOS transistor P1 and the NMOS transistor N1 in common.

The absolute value of the threshold of the PMOS transistor P2 is about 0.6 to 0.8 V. Therefore, the PMOS transistor P2 is kept ON even if the potential of the input-output line W is increased to (⅔) Vp (for example, 2 V) at a time Ts as well as the case where the potential of the input-output line W is 0. Accordingly, the PMOS transistor P2 is kept ON until feedforward operation is performed on the potential of the input-output line W to almost reach VDD. In that case, the function of the PMOS transistor P2 is the same as that of the resistor R0. In addition, the PMOS transistor P0 is kept ON also in the case where the PMOS transistor P2 is kept OFF. Consequently, the feedforward operation is not deteriorated.

Both the NMOS transistor N0 and the PMOS transistor P2 are kept ON for some period while the feedforward operation is not performed (the delay time TL). Accordingly, as the current driving force of the PMOS transistor P2 is made greater, power consumption is increased and a speed at which a potential PDR drops is decreased.

In order to avoid such situation, it is desired that the current driving force of the PMOS transistor P2 is set much smaller than that of the NMOS transistor N0.

Variation in resistance value is increased by the change of the process of forming the resistor. By using the MOS transistor in place of the resistor, the variation can be controlled.

The area of the MOS transistor is smaller than that of a resistive element. Consequently, the necessary dimension can be reduced.

Third Embodiment

Figure 4:
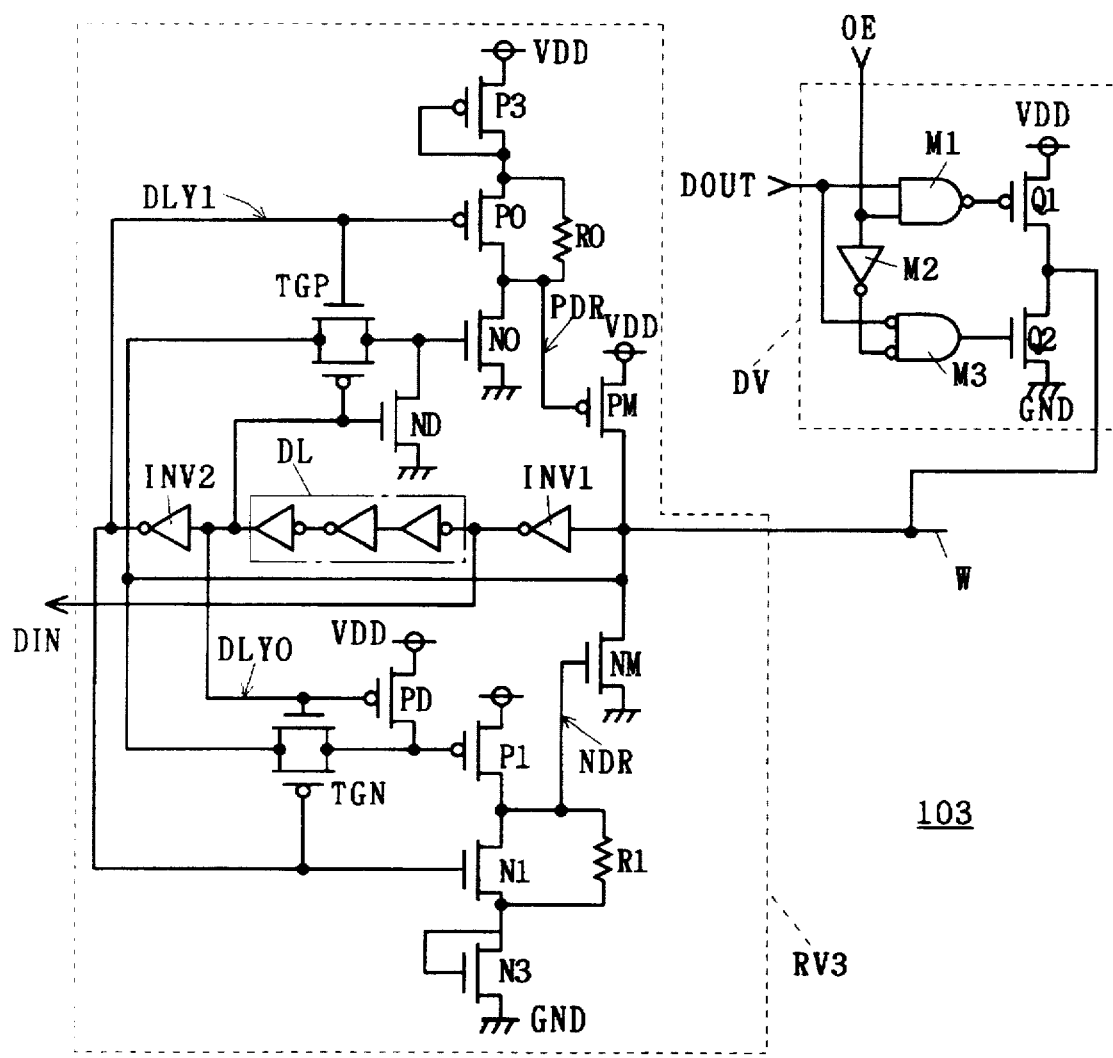
FIG. 4 is a circuit diagram showing a structure according to a third embodiment of the present invention.

FIG. 4 is a circuit diagram showing the structure of an input-output circuit 103 according to a third embodiment of the present invention. The input circuit RV1 of the input-output circuit 101 described in the first embodiment is replaced with an input circuit RV3. The input circuit RV3 has a structure in which diodes implemented by a PMOS transistor P3 and an NMOS transistor N3 are added to the input circuit RV1.

In the input circuit RV3, the source of the PMOS transistor P0 is connected to one of ends of the resistor R0 in common. In contrast to the input circuit RV1, the potential VDD is not directly given to the source of the PMOS transistor P0 and the end of the resistor R0 but a potential which is lower than the potential VDD by a predetermined voltage VB supported by the diode that is implemented by the PMOS transistor P3 is given to them. The diode is implemented by the MOS transistor so that the voltage VB can be set to a threshold voltage Vthp.

For this reason, the potential PDR of a PMOS transistor PM is decreased to a potential (VDD−|Vthp|) even if the NMOS transistor N0 is kept OFF. Consequently, a timing at which the PMOS transistor PM is turned ON/OFF corresponding to the ON/OFF operation of the NMOS transistor N0 can be increased.

In the input circuit RV3, similarly, the source of the NMOS transistor N1 is connected to one of ends of the resistor R1 in common. In contrast to the input circuit RV1, the potential GND is not directly given to the source of the NMOS transistor N1 and the end of the resistor R1 but a potential which is higher than the potential GND by a predetermined voltage which equals to the threshold voltage Vthn supported by the diode that is implemented by the NMOS transistor N3 is given to them. Consequently, a timing at which the NMOS transistor NM is turned ON/OFF is increased.

Accordingly, a delay time TL can be reduced. As described in the first embodiment, it is desired that the delay time TL is smaller than twice the delay time Ts. In general, the delay time of a transmission line is proportional to the physical length thereof. Consequently, as the transmission line is mounted more densely, the delay time Ts is reduced. In other words, it is required that the delay time TL is small. The present embodiment can meet such a requirement.

Fourth Embodiment

Figure 5:
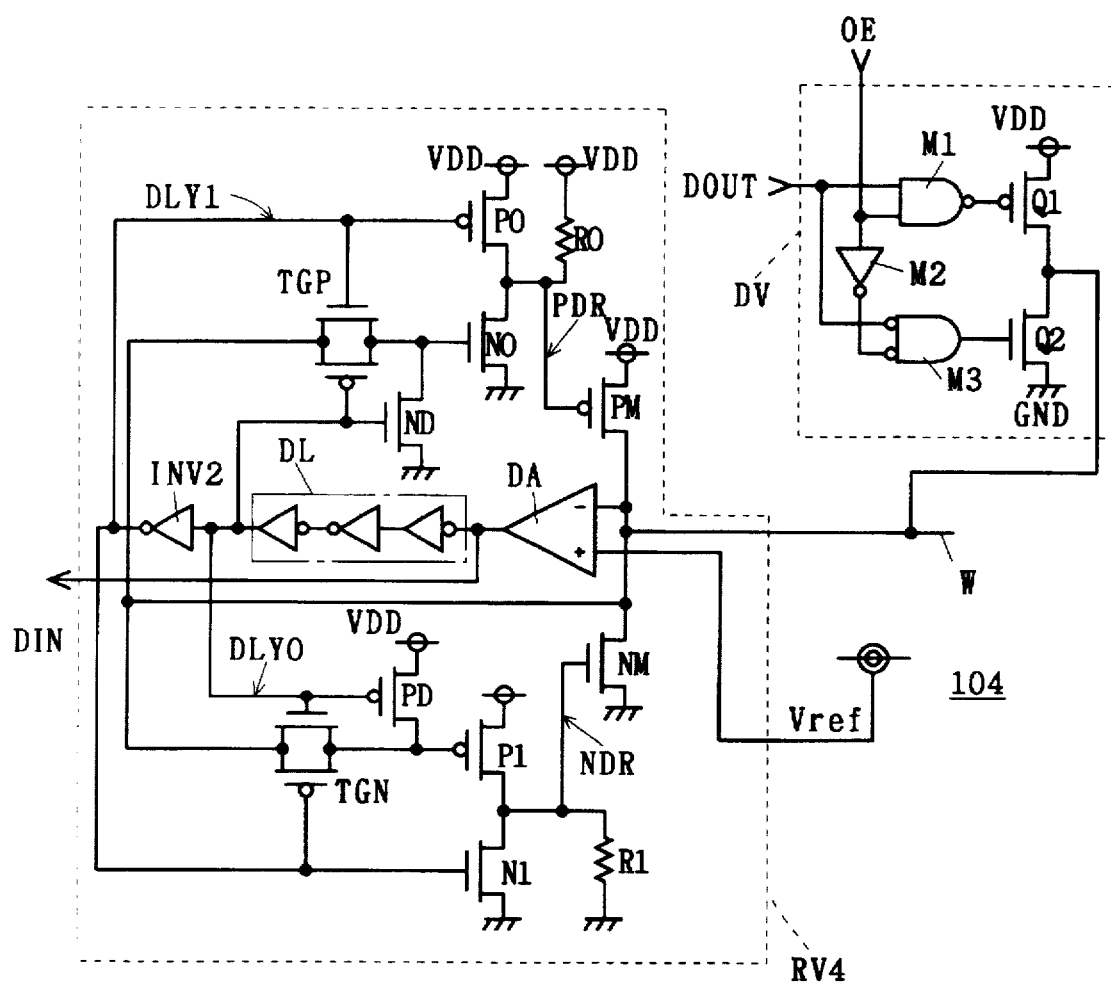
FIG. 5 is a circuit diagram showing a structure according to a fourth embodiment of the present invention.

FIG. 5 is a circuit diagram showing the structure of an input-output circuit 104 according to a fourth embodiment of the present invention. The input circuit RV1 of the input-output circuit 101 described in the first embodiment is replaced with an input circuit RV4. The input circuit RV4 has a structure in which the inverter circuit INV1 of the input circuit RV1 is replaced with a differential input amplifier DA.

In the input circuit RV4, the differential input amplifier DA has an inverted input end connected to the input-output line W and a non-inverted input end connected to a reference potential point for giving a reference potential Vref. For example, the reference potential Vref is set to (VDD−GND)/2.

Even if the logic given to the input-output line W does not perform full-swing, the differential input amplifier DA causes the logic to be inverted and to perform full-swing. Consequently, the transition of signals DLY0 and DLY1 is executed rapidly so that a delay time TL necessary for feedforward operation can be reduced.

The logic given to the input-output line W need not perform full-swing. However, it is desired that a high level has a potential of (VDD−|Vthp|) or more and a low level has a potential of (GND+Vthn) or less as described in the first embodiment.

Fifth Embodiment

Figure 6:
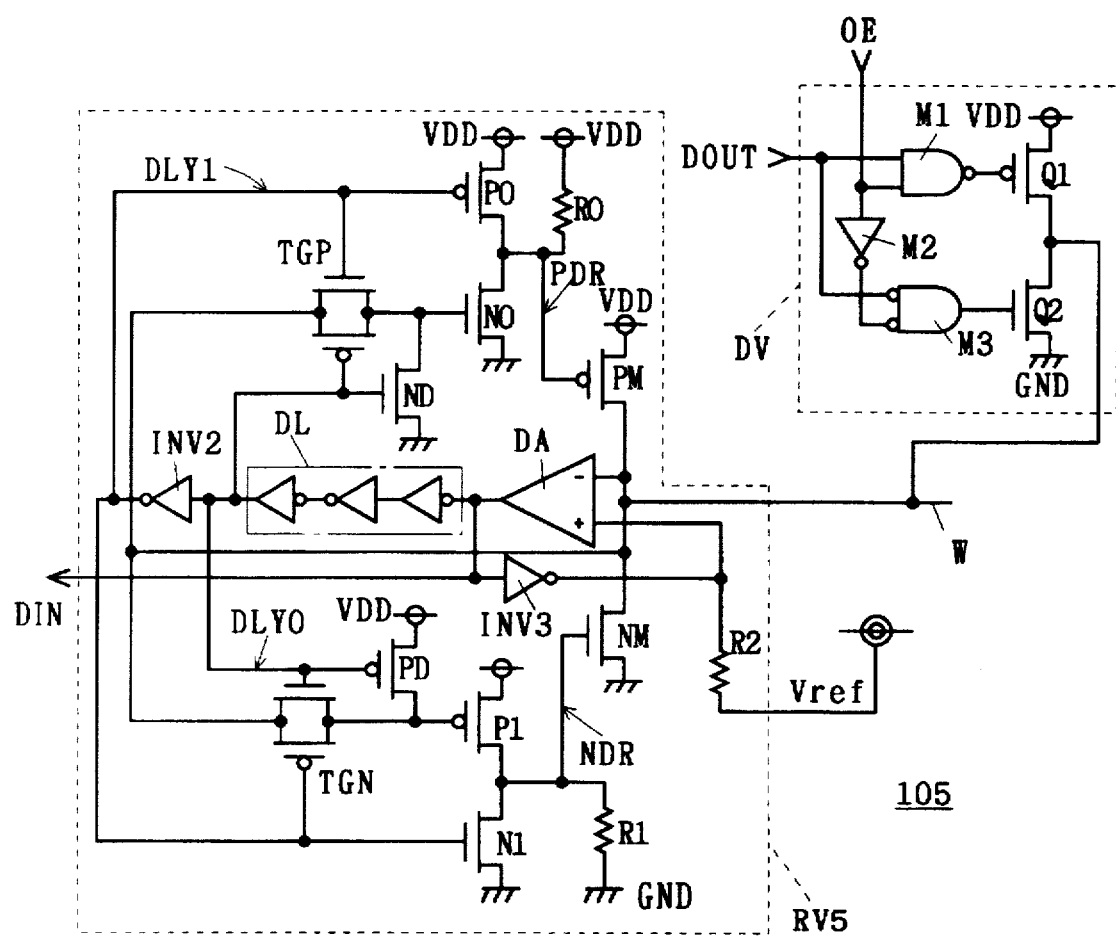
FIG. 6 is a circuit diagram showing a structure according to a fifth embodiment of the present invention.

FIG. 6 is a circuit diagram showing the structure of an input-output circuit 105 according to a fifth embodiment of the present invention. The input circuit RV4 of the input-output circuit 104 described in the fourth embodiment is replaced with an input circuit RV5. The input circuit RV5 has a structure in which a resistor R2 and an inverter circuit INV3 are added to the input circuit RV4.

In the input circuit RV5, the reference potential point is not directly connected to the non-inverted input end of the differential input amplifier DA. The first and second ends of the resistor R2 are connected to the non-inverted input end of the differential input amplifier DA and the reference potential point respectively. Furthermore, the output and input ends of the inverter circuit INV3 are connected to the non-inverted input end and output end of the differential input amplifier DA respectively.

Figure 7:
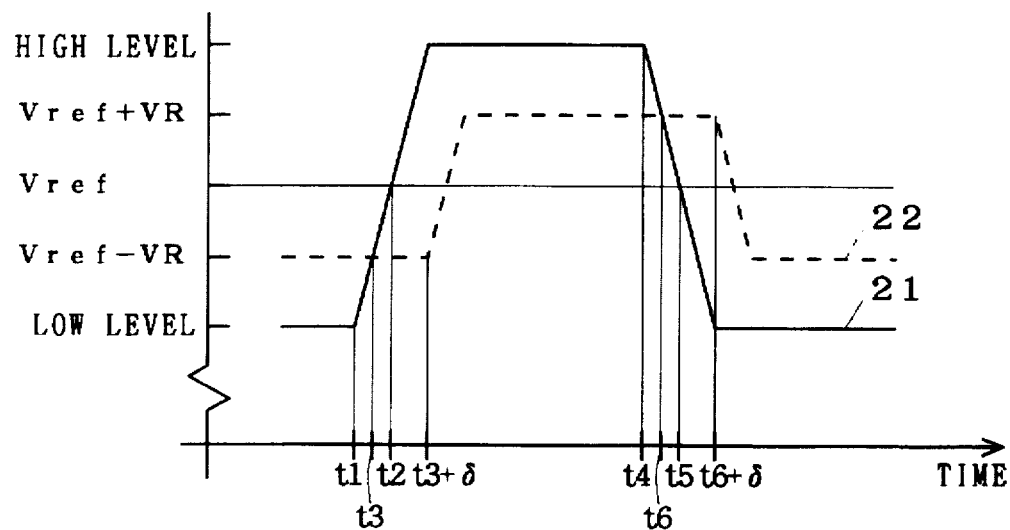
FIG. 7 is a graph showing operation according to the fifth embodiment of the present invention.

FIG. 7 is a graph showing the relationship between the transition 21 of the potential of the input-output line W and the transition 22 of the potential on the non-inverted input end of the differential input amplifier DA. When the potential of the input-output line W has a low level, a current is sunk into the inverter circuit INV3 so that the current flows to the resistor R2 in the direction of the non-inverted input end of the differential input amplifier DA. Consequently, a voltage drop VR (>0) is generated on the resistor R2, and a potential (Vref−VR) is given to the non-inverted input end of the differential input amplifier DA.

In such state, a time t3 is reached. Even if the potential of the input-output line W is changed to a high level, the potential of the output end of the inverter circuit INV3 is not changed until a delay time δ passes. Accordingly, the differential input amplifier DA decides whether the potential of the input-output line W has the high or low level based on the potential (Vref−VR). Consequently, it is decided that the potential of the input-output line W has the high level at a time t3 before a time t2 when the potential of the input-output line W reaches a reference potential Vref.

In the same manner as the foregoing, the potential of the input-output line W is changed from the high level to the low level at a time t6. The potential of the output end of the inverter circuit INV3 is not changed until the delay time δ passes. Consequently, it is decided that the potential of the input-output line W has the low level at a time t6 before a time t5 when the potential of the input-output line W reaches the reference potential Vref. As described above, the time necessary for deciding the transition of the potential of the input-output line W can be reduced. As a result, the operating speed of the input circuit can be enhanced still more.

Sixth Embodiment

Figure 8:
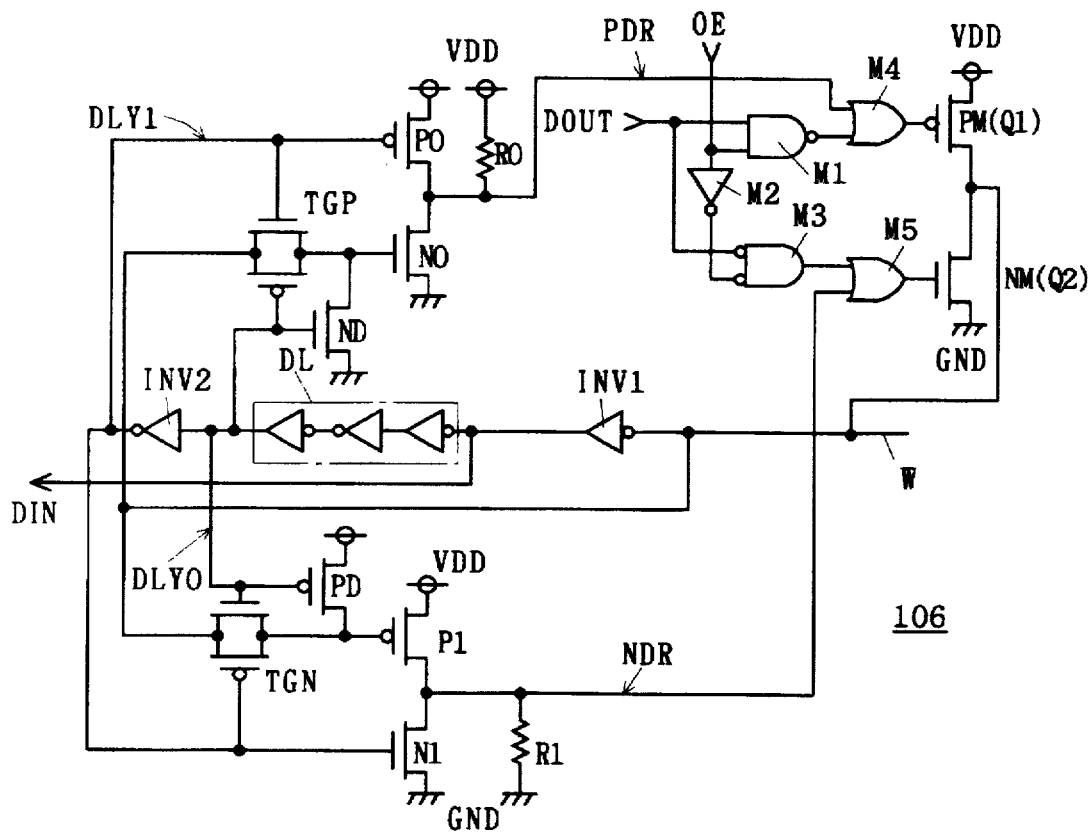
FIG. 8 is a circuit diagram showing a structure according to a sixth embodiment of the present invention.

FIG. 8 is a circuit diagram showing the structure of an input-output circuit 106 according to a sixth embodiment of the present invention. The PMOS transistor PM and the NMOS transistor NM of the input circuit RV1 of the input-output circuit 101 described in the first embodiment also serve as the PMOS transistor Q1 and the NMOS transistor Q2 of the output circuit DV respectively. The functions of the transistors are switched by 2-input OR circuits M4 and M5.

In more detail, the output end of the NAND circuit M1 is connected to the first input end of the OR circuit M4, and the drains of transistors P0 and N0 and the second end of the resistor R0 are connected to the second input end of the OR circuit M4 in common. The output end of an NOR circuit M3 is connected to the first input end of the OR circuit M5, and the drains of transistors P1 and N1 and the second end of the resistor R1 are connected to the second input end of the OR circuit M5 in common.

Thus, a transistor which functions as the driver of the output circuit also serves as the transistor which functions as the driver for the feedforward operation of an input circuit. Consequently, the number of transistors can be decreased so that the necessary area can be reduced.

Seventh Embodiment

Figure 9:
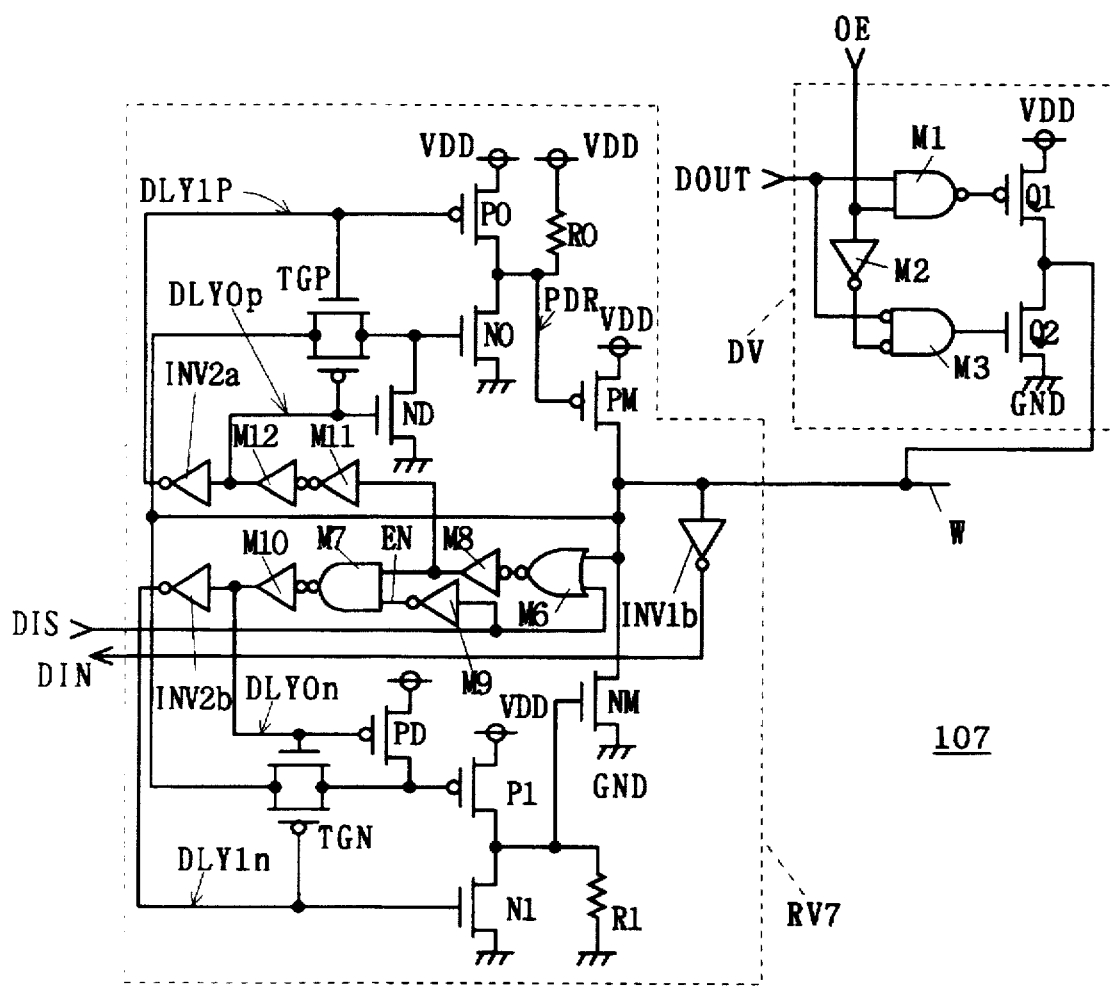
FIG. 9 is a circuit diagram showing a structure according to a seventh embodiment of the present invention.

FIG. 9 is a circuit diagram showing the structure of an input-output circuit 107 according to a seventh embodiment of the present invention. As compared with the input circuit RV1 of the input-output circuit 101 described in the first embodiment, the inverter circuit INV2 is replaced with an inverter circuit INV2a for driving the PMOS transistor P0 and with an inverter circuit INV2b for driving the NMOS transistor N1. The inverter circuit INV1 is replaced with a 2-input NOR circuit M6 and an inverter circuit INV1b. The delay element DL is replaced with a 2-input NAND circuit M7 and inverter circuits M8 to M12.

The input-output line W is connected to the first input end of the NOR circuit M6 in common with the drains of transistors PM and NM. A feedforward inhibiting signal DIS is sent to the second input end of the NOR circuit M6. The input end of the inverter circuit M8 is connected to the output end of the NOR circuit M6.

The input end of the inverter circuit INV1b is connected to the input-output line W. An input signal DIN is output from the output end of the inverter circuit INV1b.

The output end of the inverter circuit M8 is connected to the first input end of the NAND circuit M7. The output end of the inverter circuit M9 is connected to the second input end of the NAND circuit M7. The feedforward inhibiting signal DIS is sent to the input end of the inverter circuit M9. A feedforward enabling signal EN as logic inversion is output from the output end of the inverter circuit M9.

The output end of the NAND circuit M7 is connected to the input end of the inverter circuit M10. The output end of the inverter circuit M10 is connected to the input end of the inverter circuit INV2b, the gate of an NMOS transistor which forms a transmission gate TGN, and the gate of a PMOS transistor PD in common, and outputs a signal DLY0n.

The output end of the inverter circuit INV2b is connected to the gate of a PMOS transistor which forms the transmission gate TGN, and the gate of an NMOS transistor N1 in common, and outputs a signal DLY1n.

The output end of the inverter circuit M8 is connected to the input end of the inverter circuit M11. The input end of the inverter circuit M12 is connected to the output end of the inverter circuit M11. The output end of the inverter circuit M12 is connected to the input end of the inverter circuit INV2a, the gate of a PMOS transistor which forms a transmission gate TGP, and the gate of an NMOS transistor ND in common, and outputs a signal DLY0p.

The output end of the inverter circuit INV2a is connected to the gate of an NMOS transistor which forms the transmission gate TGP, and the gate of a PMOS transistor P0 in common, and outputs a signal DLY1p.

If the feedforward inhibiting signal DIS has a low level (the feedforward enabling signal EN has a high level), the NOR circuit M6 and the NAND circuit M7 function as inverter circuits. For this reason, the signals DLY0n and DLY0p output from the inverter circuits M10 and M12, respectively, are coincident with the signal DLY0 described in the first embodiment. The signals DLY1p and DLY1n output from the inverter circuits INV2a and INV2b, respectively, are coincident with the signal DLY1 described in the first embodiment. Accordingly, the operation of an input circuit RV7 is the same as that of the input circuit RV1.

If the feedforward inhibiting signal DIS has a high level (the feedforward enabling signal EN has a low level), the NOR circuit M6 and NAND circuit M7 output the low and high levels, respectively, irrespective of a voltage applied to the input-output line W. For this reason, the signals DLY0p and DLY1n have the high level and the signals DLY1p and DLY0n have the low level. Accordingly, the transistors P0 and N1 are turned ON and the transistors N0 and P1 are turned OFF so that the transistors PM and NM are turned OFF. Consequently, the input-output line W receives the high-impedance state so that feedforward operation is not performed.

If the feedforward operation is not desired, for example, the frequency of a signal sent to the input-output line W is low, the feedforward inhibiting signal DIS is set to the high level to inhibit current flow to the transistors PM and NM so that power consumption can be reduced.

Eighth Embodiment

Figure 10:
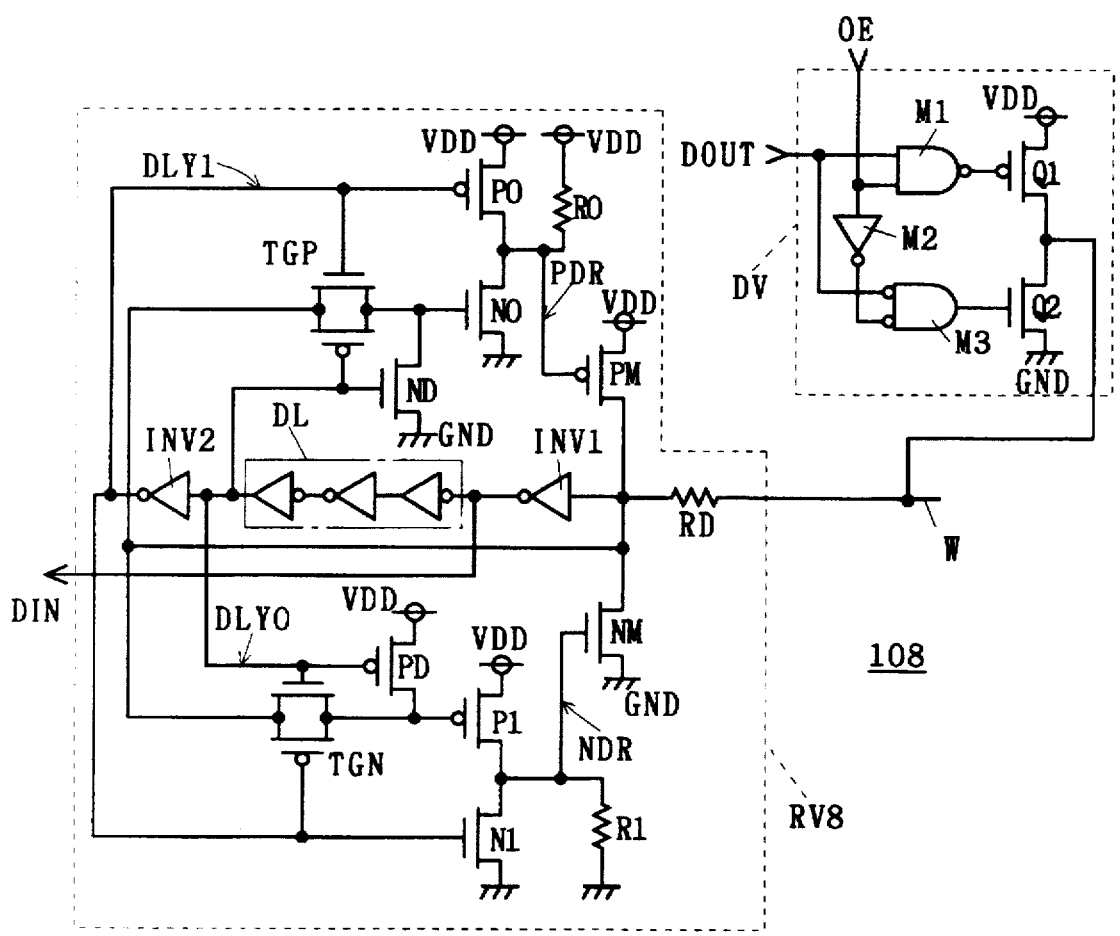
FIG. 10 is a circuit diagram showing a structure according to an eighth embodiment of the present invention.
Figure 11:
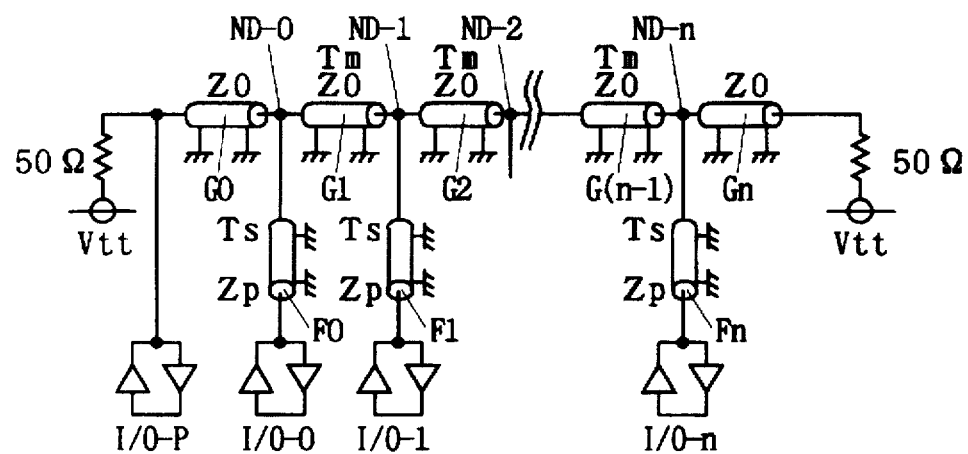
FIG. 11 is a circuit diagram typically showing the connection of a processor to a module.
Figure 12:
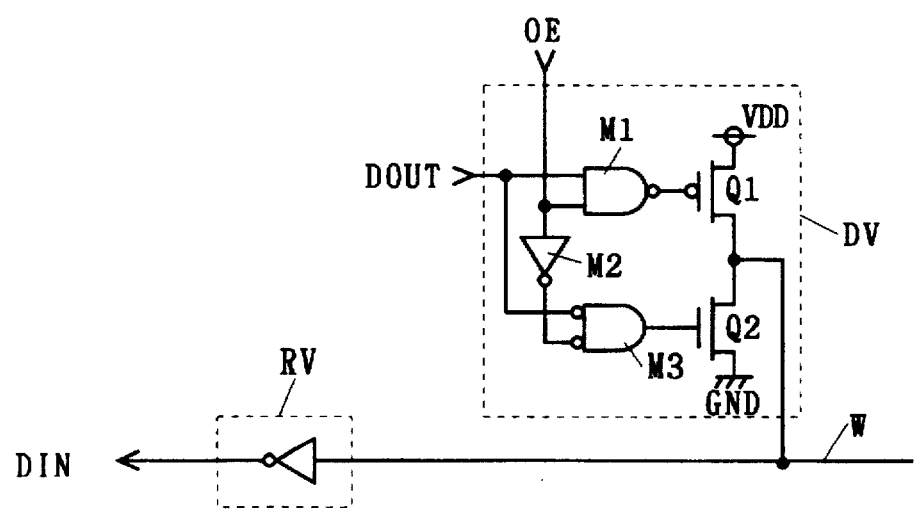
FIG. 12 is a circuit diagram showing the structure of an input-output circuit according to the back ground art.
Figure 13:
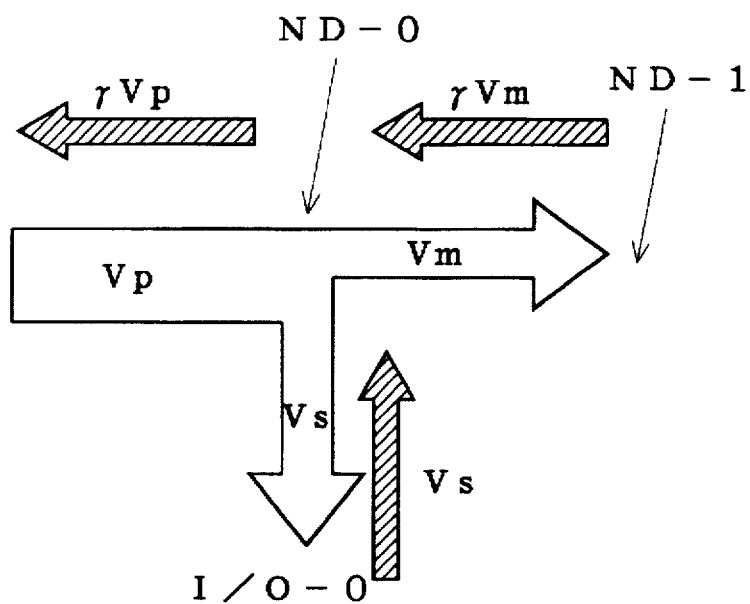
FIG. 13 is a conceptual diagram typically showing the state in which date is transmitted.

FIG. 10 is a circuit diagram showing the structure of an input-output circuit 108 according to an eighth embodiment of the present invention. The input circuit RV1 of the input-output circuit 101 described in the first embodiment is replaced with an input circuit RV8. The input circuit RV8 has a structure in which a resistor RD is added to the input circuit RV1. More specifically, the resistor RD has a first end connected to the drains of transistors PM and NM in common, and a second end connected to the input-output line W.

As shown in FIG. 2, feedforward operation is performed so that the potential of the input-output line W performs full-swing in the operation of the input circuit RV1. However, reflected waves arrive even if the feedforward operation is being performed. Consequently, if the reflected waves having the same sign arrive, an overshoot s occurs on the potential of the input-output line W.

According to the present embodiment, the resistor RD is provided so that the potential of the input-output line W reaches at most a potential determined by the partial pressure ratio of a termination resistor Ro to the resistor RD. Consequently, the overshoot s can be suppressed.

After a delay time TD passes, both the driver transistors PM and NM are turned OFF. Accordingly, the potential of the input-output line W can perform full-swing in the steady state in which the overshoot s does not occur.

While the invention has been described in detail, the foregoing description is in all aspects illustrative and not restrictive. It is understood that numerous other modifications and variations can be devised without departing from the scope of the invention.

I claim:

1. An input circuit in which potentials present within first and second ranges correspond to first and second binary logics, respectively, comprising;

(a) an input line on which an input potential is transmitted, (b) first driving means for forcibly putting said input potential in said second range when a first driving control signal is activated, and (c) first driving control means for activating said first driving control signal for a constant period after a first transition in which said input potential is transferred from said first range to said second range.

2. The input circuit according to claim 1, wherein said input potential also performs a second transition from said second range to said first range, said first driving control means comprising;

(c-1) a delay element including an input end connected to said input line, and an output end for outputting a delay input signal, said delay input signal performing third and fourth transitions delayed for said constant period after first and second transitions respectively, (c-2) a first switch including a first end connected to said input line and a second end for outputting a first control signal, said first switch being non-conductive corresponding to the value of said delay input signal obtained by said third transition, and being conductive corresponding to the value of said delay input signal obtained by said fourth transition, and (c-3) a second switch including a first end to which a potential equivalent to said first driving control signal that is activated is given, and a second end for outputting said first driving control signal, said second switch being non-conductive if said first control signal is present within said first range, and being conductive if said first control signal is present within said second range.

3. The input circuit according to claim 2, wherein said delay element includes a series connection of plural inverters.

4. The input circuit according to claim 2, wherein said first switch is a transmission gate.

5. The input circuit according to claim 2, wherein said first driving control means further comprises;

(c-4) a third switch including a first end to which a potential present within said first range is given, and a second end connected to said second end of said first switch for outputting said first control signal, said third switch being conductive/non-conductive complementarily to said first switch.

6. The input circuit according to claim 5, wherein said first driving control means further comprises;

(c-5) a first potential specifying means including a first end to which a potential equivalent to said driving control signal which is deactivated is given, and a second end connected to said second end of said second switch.

7. The input circuit according to claim 6, wherein said first potential specifying means comprises;

(c-5-1) a fourth switch including first and second ends connected to said first and second ends of said first potential specifying means respectively, said fourth switch being conductive if said delay input signal is present within said second range, and (c-5-2) a potential specified resistor connected to said fourth switch in parallel.

8. The input circuit according to claim 7, wherein said potential specified resistor is formed by a MOS transistor which includes first and second ends connected to said first and second ends of said first potential specifying means respectively, said MOS transistor being conductive/non-conductive respectively if said input potential is present within said first and second ranges.

9. The input circuit according to claim 6, wherein said first driving means comprises;

(b-1) a driving MOS transistor including a source to which a first potential present at the farthest limit from said first range within said second range is given, a drain connected to said input line, and a gate electrode, said gate electrode of said driving MOS transistor being connected to said second end of said first potential specifying means, said first driving control signal being activated and deactivated within said first and second ranges respectively, and said first driving control means further comprises;

(c-6) a voltage supporting element including a first end to which said first potential is given, and a second end connected to said first end of said first potential specifying means, said voltage supporting element supporting a voltage equal to a threshold voltage of said driving MOS transistor between said first and second ends.

10. The input circuit according to claim 2, wherein said first driving control means further comprises;

(c-4) a differential input amplifier inserted between said input line and said input end of said delay element, the first input end, the second input end and the output end of said differential input amplifier being connected to said input line, a reference potential point, and said input end of said delay element respectively.

11. The input circuit according to claim 10, wherein said second input end of said differential input amplifier is connected to a reference potential point through a potential suppress resistor, and wherein the transition of a signal output from said output end of said differential input amplifier is delayed and transmitted to said second input end of said differential input amplifier.

12. The input circuit according to claim 11, wherein said first and second input ends of said differential input amplifier are inverted and non-inverted input ends respectively, said first driving control means further comprising;

(c-5) an inverter including an input end connected to said output end of said differential input amplifier, and an output end connected to said second input end of said differential input amplifier.

13. The input circuit according to claim 1, further comprising;

(d) a driving suppress resistor inserted between said input line and said first driving means.

14. The input circuit according to claim 2, further comprising;

(d) second driving means for forcibly putting said input potential in said first range if a second driving control signal is activated, and (e) second driving control means for activating said second driving control signal for a constant period after a second transition in which said input potential is transferred from said second range to said first range.

15. The input circuit according to claim 14, wherein said second driving control means comprises;

(e-1) a first switch including a first end connected to said input line and a second end for outputting a second control signal, said first switch being non-conductive corresponding to the value of said delay input signal obtained by said fourth transition, and being conductive corresponding to the value of said delay input signal obtained by said third transition, and (e-2) a second switch including a first end to which a potential equivalent to said driving control signal that is activated is given, and a second end for outputting said second driving control signal said second switch being conductive if said second control signal is present within said first range, and being non-conductive if said second control signal is present within said second range.

16. The input circuit according to claim 15, wherein said second driving control means further comprises;

(e-3) a third switch including a first end to which a potential present within said second range is given, and a second end connected to said second end of said first switch of said second driving means for outputting said second control signal, said third switch being conductive/non-conductive complementarily to said first switch of said second driving means.

17. The input circuit according to claim 14, further comprising;

(f) a first logic circuit that includes a first input end to which one of a pair of complementary output signals is input and a second input end to which said first driving control signal is sent, and outputs an OR function of data given to said first and second input ends to said first driving means, and (g) a second logic circuit that includes a first input end to which the other of said pair of complementary output signal is input and a second input end to which said second driving control signal is sent, and outputs an OR function of data given to said first and second input ends to said second driving means.

18. The input circuit according to claim 2, wherein said first driving control means further comprises;

(c-4) a logic circuit gating an input signal for said delay element according to a switching signal, said logic circuit causing said first switch to be non-conductive and fixing said first control signal to a predetermined logic level in response to said switching signal.

19. The input circuit according to claim 14, further comprising:

a delay element including first series connection of gates for said first driving control means and second series connection of gates for said second driving control means, said second driving control means further comprising;

(c-4) logic gates inserted in said first and second series connection of gates in series for receiving a switching signal, said logic gates causing said first switch to be non-conductive and fixing said second control signal to a predetermined logic level in response to said switching signal.

* * * * *